(12) United States Patent
Suzuki

(10) Patent No.: US 10,307,842 B2
(45) Date of Patent: Jun. 4, 2019

(54) DUST COLLECTOR

(71) Applicant: MAKITA CORPORATION, Anjo-shi, Aichi (JP)

(72) Inventor: Hitoshi Suzuki, Anjo (JP)

(73) Assignee: MAKITA CORPORATION, Anjo-Shi (JP)

( * ) Notice: Subject to any disclaimer, the term of this patent is extended or adjusted under 35 U.S.C. 154(b) by 0 days.

(21) Appl. No.: 15/952,660

(22) Filed: Apr. 13, 2018

(65) Prior Publication Data

US 2018/0229317 A1 Aug. 16, 2018

Related U.S. Application Data

(63) Continuation of application No. 14/906,413, filed as application No. PCT/JP2014/070376 on Aug. 1, 2014, now Pat. No. 9,962,781.

(30) Foreign Application Priority Data

Aug. 2, 2013 (JP) .................. 2013-161506
Aug. 2, 2013 (JP) .................. 2013-161507

(51) Int. Cl.
*G05B 11/01* (2006.01)
*B23D 59/00* (2006.01)
(Continued)

(52) U.S. Cl.
CPC .......... *B23D 59/006* (2013.01); *A47L 9/2868* (2013.01); *B23D 59/001* (2013.01);
(Continued)

(58) Field of Classification Search
CPC ...... A47L 2201/02; A47L 5/38; A47L 7/0095; A47L 9/28; A47L 9/2868; A47L 9/2873;
(Continued)

(56) References Cited

U.S. PATENT DOCUMENTS 4,525,739 A 6/1985 Fitzgerald
5,274,878 A 1/1994 Radabaugh et al.
(Continued)

FOREIGN PATENT DOCUMENTS

CN 1486797 A 4/2004
CN 101370416 A 2/2009
(Continued)

OTHER PUBLICATIONS

Oct. 7, 2014 International Search Report issued in International Patent Application No. PCT/JP2014/070376.
(Continued)

*Primary Examiner* — Carlos Garcia
(74) *Attorney, Agent, or Firm* — Oliff PLC

(57) ABSTRACT

A dust collector in one aspect of the present invention comprises a dust collection portion, a communication portion, and an interlock operation control portion. When the communication portion receives an interlock command transmitted from an electric working machine, the interlock operation control portion makes the dust collection portion operate interlocking with the electric working machine. The interlock operation control portion includes a storage portion, in which identification information specific to the electric working machine with which the dust collection portion is to be made to perform the interlock operation is stored.

11 Claims, 11 Drawing Sheets

(51) Int. Cl.
*A47L 9/28* (2006.01)
*B23Q 11/00* (2006.01)
*G08C 17/02* (2006.01)
*B24B 23/02* (2006.01)
*B24B 55/00* (2006.01)
*B24B 55/10* (2006.01)

(52) U.S. Cl.
CPC ...... *B23Q 11/0046* (2013.01); *B23Q 11/0071* (2013.01); *B24B 23/028* (2013.01); *B24B 55/00* (2013.01); *B24B 55/10* (2013.01); *G08C 17/02* (2013.01)

(58) Field of Classification Search
CPC ..... A47L 9/2889; A47L 9/2894; B23D 59/00; B23D 59/001; B23Q 11/0046; B23Q 11/0071; B25F 5/00; G08C 17/02
USPC ...... 15/246.2, 246, 301, 339, 347; 340/12.5, 340/12.51, 4.36, 680, 686.2, 686.4, 687
See application file for complete search history.

(56) References Cited

U.S. PATENT DOCUMENTS

| | | | |
|---|---|---|---|
| 2003/0033686 | A1 | 2/2003 | Liu |
| 2003/0042796 | A1 | 3/2003 | Siu |
| 2004/0060145 | A1* | 4/2004 | Hayama ............... A47L 7/0085 15/339 |
| 2004/0078116 | A1 | 4/2004 | Hashimoto et al. |
| 2007/0135779 | A1* | 6/2007 | Lalomia .............. A61M 1/0005 604/319 |
| 2008/0284659 | A1 | 11/2008 | Ikeyama |
| 2009/0033459 | A1 | 2/2009 | Ichihara |
| 2009/0266382 | A1* | 10/2009 | Hwang ................. A47L 5/365 134/21 |
| 2010/0106299 | A1* | 4/2010 | Nagata .................... B25J 13/06 700/264 |
| 2010/0154161 | A1 | 6/2010 | Takahashi et al. |
| 2010/0199453 | A1 | 8/2010 | Brotto et al. |
| 2011/0113587 | A1 | 5/2011 | Nagasaka et al. |
| 2012/0216362 | A1 | 8/2012 | Cunningham et al. |
| 2014/0022053 | A1 | 1/2014 | Inoue et al. |
| 2015/0022332 | A1 | 1/2015 | Lin |

FOREIGN PATENT DOCUMENTS

| | | |
|---|---|---|
| CN | 102058348 A | 5/2011 |
| CN | 202071015 U | 12/2011 |
| CN | 202155799 U | 3/2012 |
| CN | 202895000 U | 4/2013 |
| JP | S61-188554 U | 11/1986 |
| JP | H04-197231 A | 7/1992 |
| JP | 2001-137158 A | 5/2001 |
| JP | 2002-195616 A | 4/2002 |
| JP | 2003-164395 A | 6/2003 |
| JP | 2004-148216 A | 5/2004 |
| JP | 2004-148488 A | 5/2004 |
| JP | 2004-195565 A | 7/2004 |
| JP | 2005-312893 A | 11/2005 |
| JP | 2007-245019 A | 9/2007 |
| JP | 2008-036723 A | 2/2008 |
| JP | 2009-215739 A | 9/2009 |
| JP | 2011-079082 A | 4/2011 |
| JP | 2012-070544 A | 4/2012 |
| JP | 4955332 B2 | 6/2012 |
| JP | 2013-150281 A | 8/2013 |
| WO | 2011/115121 A1 | 9/2011 |

OTHER PUBLICATIONS

Feb. 2, 2016 International Preliminary Report on Patentability issued in International Patent Application No. PCT/JP2014/070376.
Aug. 30, 2016 Office Action issued in Japanese Patent Application No. 2013-161506.
Nov. 1, 2016 Office Action issued in Chinese Patent Application No. 201480043837.2.
Dec. 20, 2016 Office Action issued in Japanese Patent Application No. 2013-161507.
May 4, 2017 Office Action Issued in U.S. Appl. No. 14/906,413.
Apr. 18, 2017 Office Action issued in Japanese Patent Application No. 2013-161506.
Apr. 18, 2017 Office Action issued in Japanese Patent Application No. 2013-161507.
Apr. 12, 2017 Search Report issued in European Patent Application No. 14833056.6.
Jul. 31, 2017 Office Action issued in Chinese Patent Application No. 201480043837.2.
Aug. 8, 2017 Office Action issued in Japanese Patent Application No. 2013-161507.
Sep. 6, 2016 Office Action issued in Japanese Patent Application No. 2013-161506.
Sep. 11, 2018 Office Action issued in Japanese Patent Application No. 2017-139160.
Apr. 24, 2018 Office Action issued in Japanese Patent Application No. 2017-139160.
Oct. 23, 2018 Office Action Issued in U.S. Appl. No. 16/140,912.

\* cited by examiner

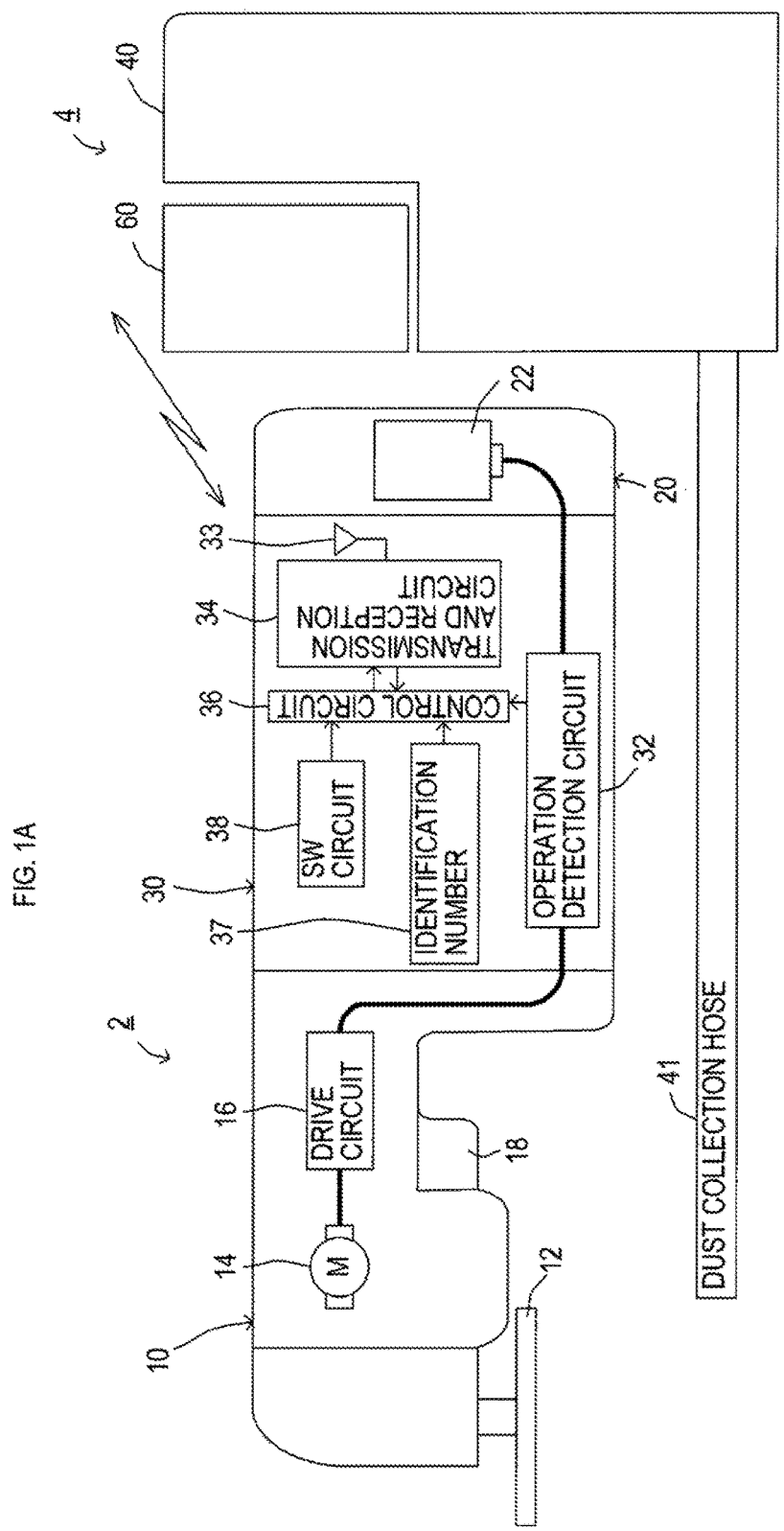

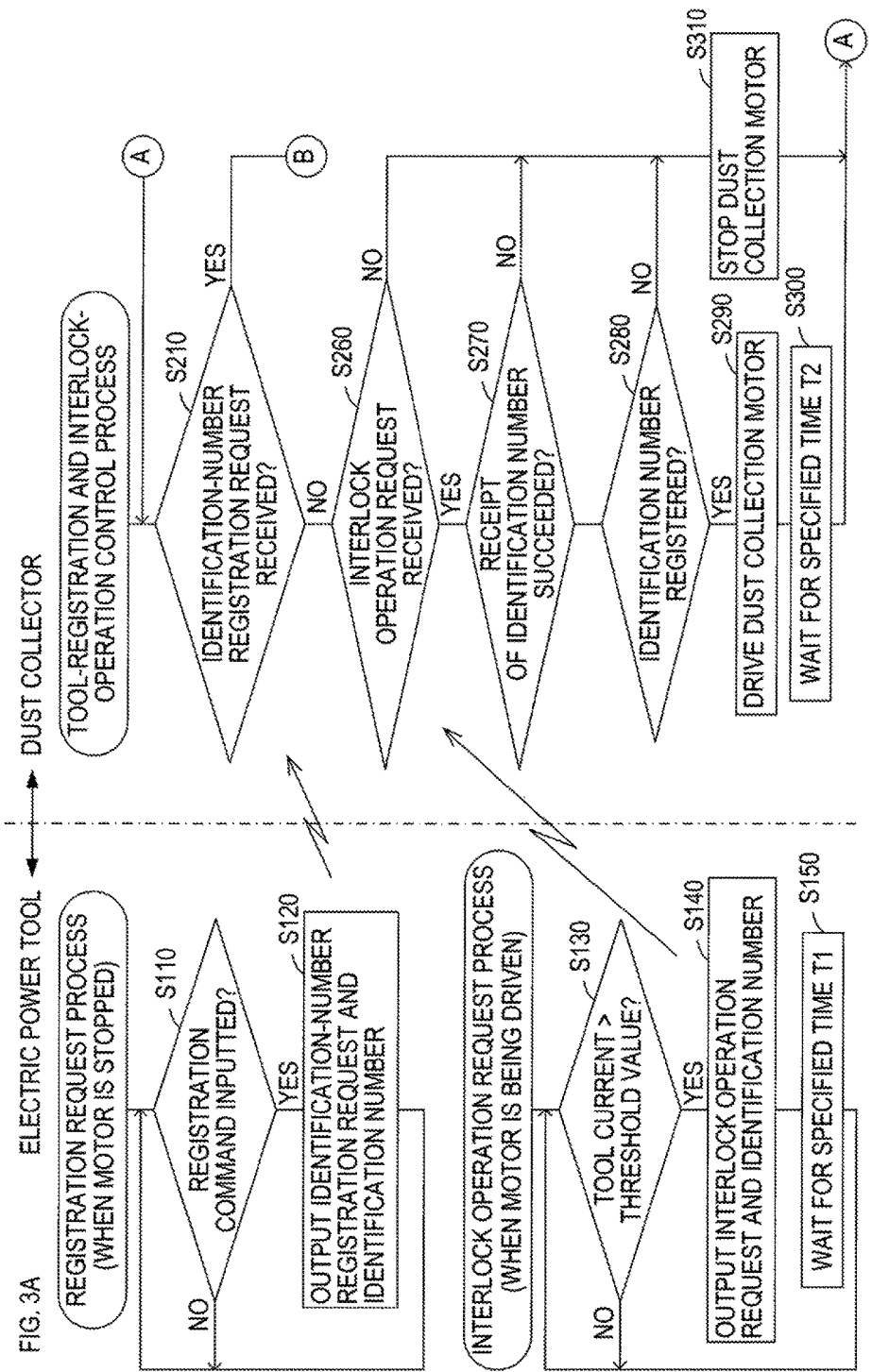

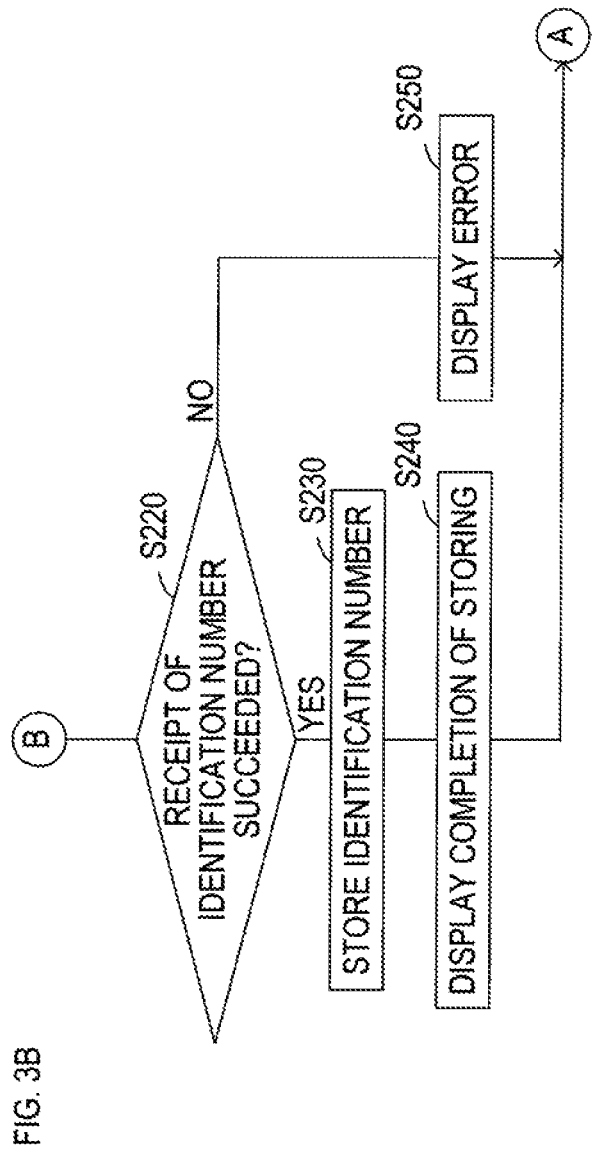

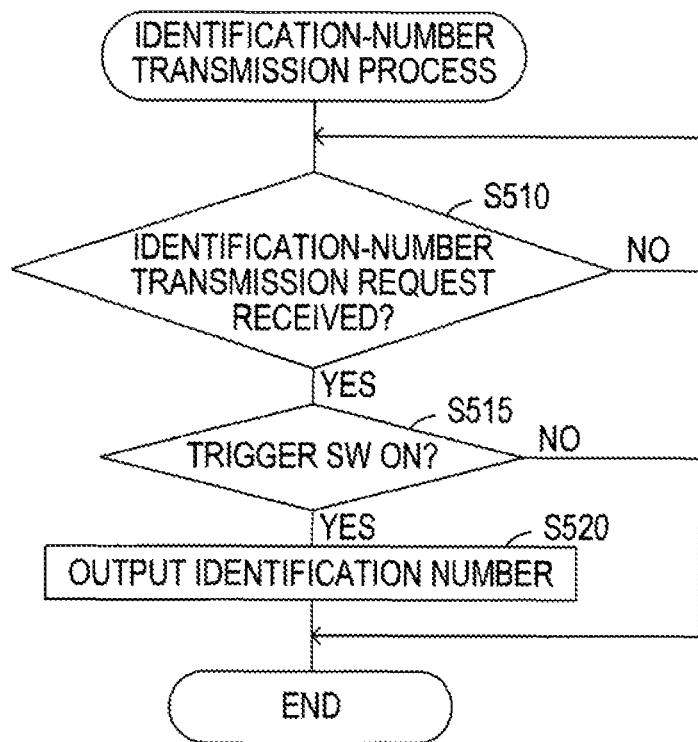

DUST COLLECTOR

CROSS-REFERENCE TO RELATED APPLICATIONS

This is a Continuation of application Ser. No. 14/906,413 filed Jan. 20, 2016, which claims the benefit of Japanese Patent Application No. 2013-161506 filed Aug. 2, 2013 in the Japan Patent Office and Japanese Patent Application No. 2013-161507 filed Aug. 2, 2013 in the Japan Patent Office. The entire disclosure of Japanese Patent Application No. 2013-161506 and the entire disclosure of Japanese Patent Application No. 2013-161507 are incorporated herein by reference.

TECHNICAL FIELD

The present invention relates to a dust collector that is capable of performing an interlock operation with an electric working machine.

BACKGROUND ART

A dust collector in one example comprises a communication unit (adapter) that receives a signal wirelessly transmitted from an electric working machine during operation of the electric working machine; the dust collector is configured to be operated when the communication unit receives the signal from the electric working machine (see, for example, Patent Document 1).

This dust collector can be operated interlocking with the electric working machine, without providing a signal line for detecting an operation state of the electric working machine between the dust collector and the electric working machine. Accordingly, this dust collector enables an interlock operation with the electric working machine even if, for example, the electric working machine is a chargeable cordless device.

PRIOR ART DOCUMENTS

Patent Documents

Patent Document 1: Japanese Patent No. 4955332

SUMMARY OF THE INVENTION

Problems to be Solved by the Invention

However, the dust collector in the above-described example starts the interlock operation upon receipt of the single transmitted from the electric working machine. For this reason, if multiple electric working machines that transmit signals for an interlock operation are present around the dust collector, the dust collector may be operated, contrary to the user's intention, by a signal from an electric working machine that does not require an interlock operation with the dust collector.

In one aspect of the present invention, it is desirable to provide the following dust collector: even if multiple electric working machines are present around the dust collector, the dust collector can perform an interlock operation only when the dust collector receives a signal from an electric working machine that requires the interlock operation.

Means for Solving the Problems

A dust collector in one aspect of the present invention comprises a dust collection portion, a communication portion, and an interlock operation control portion. The dust collection portion sucks dust through a dust collection hose. The communication portion wirelessly communicates with an electric working machine. The interlock operation control portion makes the dust collection portion perform an interlock operation with the electric working machine when the communication portion receives an interlock command transmitted from the electric working machine. The interlock operation control portion comprises a storage portion in which identification information is stored, and the identification information is specific to the electric working machine with which the dust collection portion is to be made to perform the interlock operation.

In the dust collector as configured above, the interlock operation control portion can determine whether the electric working machine transmitting the interlock command is a device to be interlocked or a device not to be interlocked.

Here, the interlock command transmitted from the electric working machine may include an interlock operation request signal requesting the interlock operation and an identification signal indicating the identification information.

In this case, based on the interlock operation request signal and the identification signal, the interlock operation control portion can determine that the interlock command has been transmitted from the electric working machine that requires the interlock operation, so as to make the dust collection portion perform the interlock operation. In addition, a timing of start of the interlock operation by the dust collection portion can be set based on the transmission of the interlock operation request signal from the electric working machine; thus, the dust collection portion can be operated properly.

The interlock operation control portion may be further configured such that when the identification information obtained from the identification signal received by the communication portion coincides with the identification information stored in the storage portion and the interlock operation request signal is received by the communication portion, the interlock operation control portion makes the dust collection portion perform the interlock operation.

In this case, the interlock operation control portion correctly recognizes that the signal received by the communication portion is the signal from the electric working machine to be interlocked, and the interlock operation can be started by the interlock operation request signal; this can further reduce possibility in which the dust collection portion is erroneously operated.

It may be configured such that while the communication portion receives the interlock command periodically and repeatedly transmitted by the electric working machine during operation of the electric working machine, the interlock operation control portion makes the dust collection portion perform the interlock operation.

Also, when the communication portion has not received the interlock command for a specified period of time or more, the interlock operation control portion may stop the interlock operation of the dust collection portion. In this case, if the interlock operation of the dust collection portion becomes unnecessary, for example, if the electric working machine stops operating or moves far away, it is possible to stop the operation of the dust collection portion.

Accordingly, compared with a configuration in which the electric working machine transmits, as the interlock command, a signal instructing to start and stop the interlock operation and the dust collector controls the start and stop of the interlock operation in accordance with the signal, the operation of the dust collection portion can be reliably stopped.

Moreover, the specified period of time before the control portion stops operation of the dust collection portion may be set to be longer than a transmission cycle in which the electric working machine periodically transmits the interlock command.

In this case, it can be more reliably determined that the electric working machine stops the interlock command, thereby to stop the operation of the dust collection portion; consequently, it is possible to suppress or inhibit that the operation of the dust collection portion is erroneously stopped.

The dust collector may further comprise a registration operation portion configured to input a command for additionally registering the identification information specific to the electric working machine with which the dust collection portion is to be made to perform the interlock operation. Also, the interlock operation control portion may additionally register the identification information in the storage portion in accordance with the command from the registration operation portion.

In this case, the electric working machine as an object of the interlock operation can be registered by the dust collector alone and thus, usability of the dust collector can be improved. Moreover, it is not necessary to provide an operation portion for registration of the identification information in the electric working machine. Thus, the electric working machine can be downsized.

Furthermore, when receiving the command for additionally register the identification information from the registration operation portion, the interlock operation control portion may transmit an identification information transmission request to a nearby electric working machine via the communication portion; and after the transmission, the interlock operation control portion may additionally register the identification information received by the communication portion in the storage portion.

In this case, when a user of the dust collector operates the registration operation portion to register, in the storage portion, the identification information of the electric working machine to be interlocked, it is not necessary to input such identification information by operating the operation portion; thus, registration operation of the identification information to the storage portion can be simplified.

Moreover, since the identification information to be registered in the storage portion is transmitted from the electric working machine, it is possible to suppress or inhibit registration of wrong identification information in the storage portion; therefore, the identification information can be correctly registered.

A receivable distance at which the electric working machine can receive a signal transmitted from the communication portion may be set to be shorter than a receivable distance at which the communication portion can receive a signal transmitted from the electric working machine.

If the receivable distance is set as describe above, the identification information transmission request can be selectively transmitted to the electric working machine(s) located in the vicinity of the dust collector; this can reduce possibility of erroneous registration of identification information of an electric working machine that does not require the interlock operation of the dust collection portion.

Here, to set the receivable distance as described above, for example, transmission power from the communication portion and receiving sensitivity in the communication portion, or transmission power and receiving sensitivity of the electric working machine, etc. may be adjusted.

Furthermore, after the interlock operation control portion transmits the identification information transmission request to the nearby electric working machine via the communication portion, when the communication portion receives a plurality of pieces of identification information, the interlock operation control portion may suspend the additional registration of the identification information in the storage portion and notify the suspension via a notification portion.

In this case, possibility of erroneous registration of identification information of an electric working machine that does not require the interlock operation of the dust collection portion can be reduced. In addition, failure of additional registration of the identification information is notified; the user can dispose an electric working machine, the identification information of which is desired to be registered, in the vicinity of the dust collector but dispose other electric working machines away from the dust collector, thereby allowing the user to try the registration again. Therefore, it is possible to improve working efficiency in the registration of the identification information.

Furthermore, when the identification information is additionally registered in the storage portion, the interlock operation control portion may notify the additional registration via the notification portion.

In this case, the user can recognize that additional registration of a new electric working machine, which becomes an object of the interlock operation, is succeeded with respect to the dust collector and therefore, improved working efficiency in the registration of the identification information can be achieved.

Furthermore, when the communication portion receives a registration request of the identification information transmitted from the electric working machine, the interlock operation control portion may additionally register the identification information in the storage portion.

In this case, although the electric working machine needs to be provided with an operation portion for transmitting the registration request of the identification information, the identification information can be additionally registered to the storage portion in accordance with the request from the electric working machine. Consequently, improved working efficiency in the registration of the identification information can be achieved.

In this case, furthermore, after the communication portion receives the registration request of the identification information, the interlock operation control portion may notify, via the notification portion, whether the identification information is additionally registered in the storage portion.

The dust collector may further comprise a deletion operation portion that inputs a command for deleting the identification information stored in the storage portion. Moreover, the interlock operation control portion may delete the identification information stored in the storage portion in accordance with the command from the deletion operation portion.

In this case, the identification information of the electric working machine to be interlocked, which is registered in the control portion, can be deleted by operating the deletion operation portion. Accordingly, it is possible to easily change an electric working machine that performs the interlock operation of the dust collector.

In addition, because unnecessary registration of the identification information in the storage portion can be deleted, a storage capacity of the storage portion can be reduced.

Furthermore, when a command for deleting the identification information is inputted from the deletion operation portion while the interlock operation control portion makes the dust collection portion perform the interlock operation, the interlock operation control portion may delete, from the storage portion, the identification information used to make the dust collection portion perform the interlock operation.

In this case, it is possible to delete, from the storage portion, the identification number of the electric working machine with which the dust collector is currently made to perform the interlock operation; thus, the identification number of the electric working machine, which is to be deleted, can be easily and correctly specified.

The dust collector may comprise a dust collector main body and a communication unit. The dust collector main body may comprise at least the dust collection portion and may operate by receiving a power supply from an external alternating current power source. The communication unit may comprise at least the communication portion; the communication unit may be attached to the dust collector main body and may receive the interlock command wirelessly transmitted from the electric working machine to output an operation command to the dust collector main body.

The dust collector main body may comprise an isolation device configured to electrically isolate the alternating current power source from the communication portion.

In this case, even if, by any chance, the user touches an internal circuit in the communication unit due to misuse of the communication unit by the user, risk of electrical shock to the user can be suppressed or inhibited.

In addition, the dust collector main body is provided as a separate body from the communication unit. Accordingly, the dust collector main body comprises a terminal for inputting/outputting signals to/from the communication unit when the communication unit is attached to the dust collector main body.

This terminal is electrically isolated from the alternating current power source. For this reason, even if the user touches the terminal when attaching the communication unit to the dust collector main body, possibility of electrical shock to the user can be reduced or eliminated and therefore, safety of the dust collector can be improved.

The isolation device may comprise an isolation transformer, and the isolation transformer may be used to take in the alternating current power inside the dust collector. In this case, not only because the isolation transformer can isolate between the communication unit and the alternating current power source, but also because electric power can be taken in from the alternating current power source via the isolation transformer, it is possible to supply electric power to an internal circuit in the dust collector main body and to the communication unit.

The isolation device may comprise a contactless circuit configured to contactlessly transmit a signal between an operation portion and the communication unit, and the operation portion is configured to operate by receiving a power supply from the alternating current power source.

In this case, it is possible to suppress or inhibit entry of noise from the alternating current power source into the communication unit via input/output of signals.

Moreover, because signals are inputted/outputted contactlessly, possibility of contact failure that occurs between signal input/output terminals can be reduced or eliminated and therefore, reliability of the dust collector can be enhanced.

The communication unit may comprise an antenna for wireless communication, a signal input/output portion, and a communication control portion. The signal input/output portion inputs and outputs a signal including the operation command to and from the dust collector main body. The communication control portion controls signals inputted and outputted via the antenna and the signal input/output portion.

In this case, the antenna may be disposed on a side opposite to the signal input/output portion across the communication control portion.

The signal input/output portion is coupled to a circuit inside the dust collector main body; in many cases, part of the signal input/output portion is a wall inhibiting wireless communication; moreover, the part may be located close to an internal circuit of the dust collector main body, which is a noise source.

When the antenna is disposed as described above, the antenna can be located away from the wall inhibiting wireless communication and the noise source, which enables to improve communication quality of the wireless communication with the electric working machine.

The dust collector main body may comprise a power supply path and a detection circuit. The power supply path supplies an electric power to the communication unit. The detection circuit detects, based on an electric current flowing to the power supply path, that the communication unit is attached.

In this case, it is possible to detect attachment of the communication unit without providing, in the dust collector main body, a terminal dedicated to detection of attachment of the communication unit. Thus, a size of a connecter for attaching the communication unit, which is provided in the dust collector main body, can be reduced, thereby achieving downsize and cost reduction of the dust collector main body.

The communication unit may comprise a case, an antenna for wireless communication, a signal input/output portion, and a communication control portion. At least the communication control portion may be covered by a waterproof resin member and housed inside the case.

In this case, the communication control portion of the communication unit is provided with two layers of waterproofing, i.e., with the case of the communication unit and with the waterproof resin member. Thus, erroneous operation of the control portion of the communication unit can be more favorably suppressed or inhibited.

BRIEF DESCRIPTION OF THE DRAWINGS

FIG. 1A is a block diagram showing a schematic configuration of a dust collector in a first embodiment and an internal configuration of an electric power tool that makes the dust collector perform an interlock operation.

FIG. 3A shows flowcharts of a registration request process and an interlock operation request process, which are executed in the electric power tool, and a flowchart of a part of a tool-registration and interlock-operation control process executed in the dust collector in response to the aforementioned request processes.

FIG. 3B is a flowchart of the rest of the tool-registration and interlock-operation control process.

FIG. 6 is a flowchart illustrating a modified example of the identification-number transmission process shown in FIG. 4A.

EXPLANATION OF REFERENCE NUMERALS

2 . . . electric power tool, 4 . . . dust collector, 10 . . . tool main body, 12 . . . cutting grindstone, 14 . . . motor, 16 . . . drive circuit, 18 . . . trigger switch, 20 . . . battery pack, 22 . . . battery, 30 . . . communication unit, 32 . . . operation detection circuit, 33 . . . antenna, 34 . . . transmission and reception circuit, 36 . . . control circuit, 37 . . . identification-number setting portion, 38 . . . SW circuit, 40 . . . dust-collector main body, 41 . . . dust collection hose, 42 . . . dust collection motor, 44 . . . dust collection motor driving circuit, 45 . . . power plug, 46 . . . changeover SW, 48 . . . signal isolation circuit, 50 . . . control circuit, 52 . . . isolated control power source, 52 . . . control circuit, 53 . . . power outlet, 54, 56 . . . current detection circuit, 58 . . . IF circuit, 60 . . . communication unit, 61 . . . antenna, 62 . . . transmission and reception circuit, 64 . . . control circuit, 66 . . . IF circuit, 68 . . . memory, 70 . . . SW circuit, 72 . . . notification circuit, 80, 90 . . . circuit board, 82 . . . component mounting area, 84, 92 . . . resin case, 86, 94 . . . outer case, 95, 96 . . . attachment portion.

MODE FOR CARRYING OUT THE INVENTION

Hereinafter, exemplified embodiments of the present invention will be described with reference to the drawings.

First Embodiment

Figure 1B:
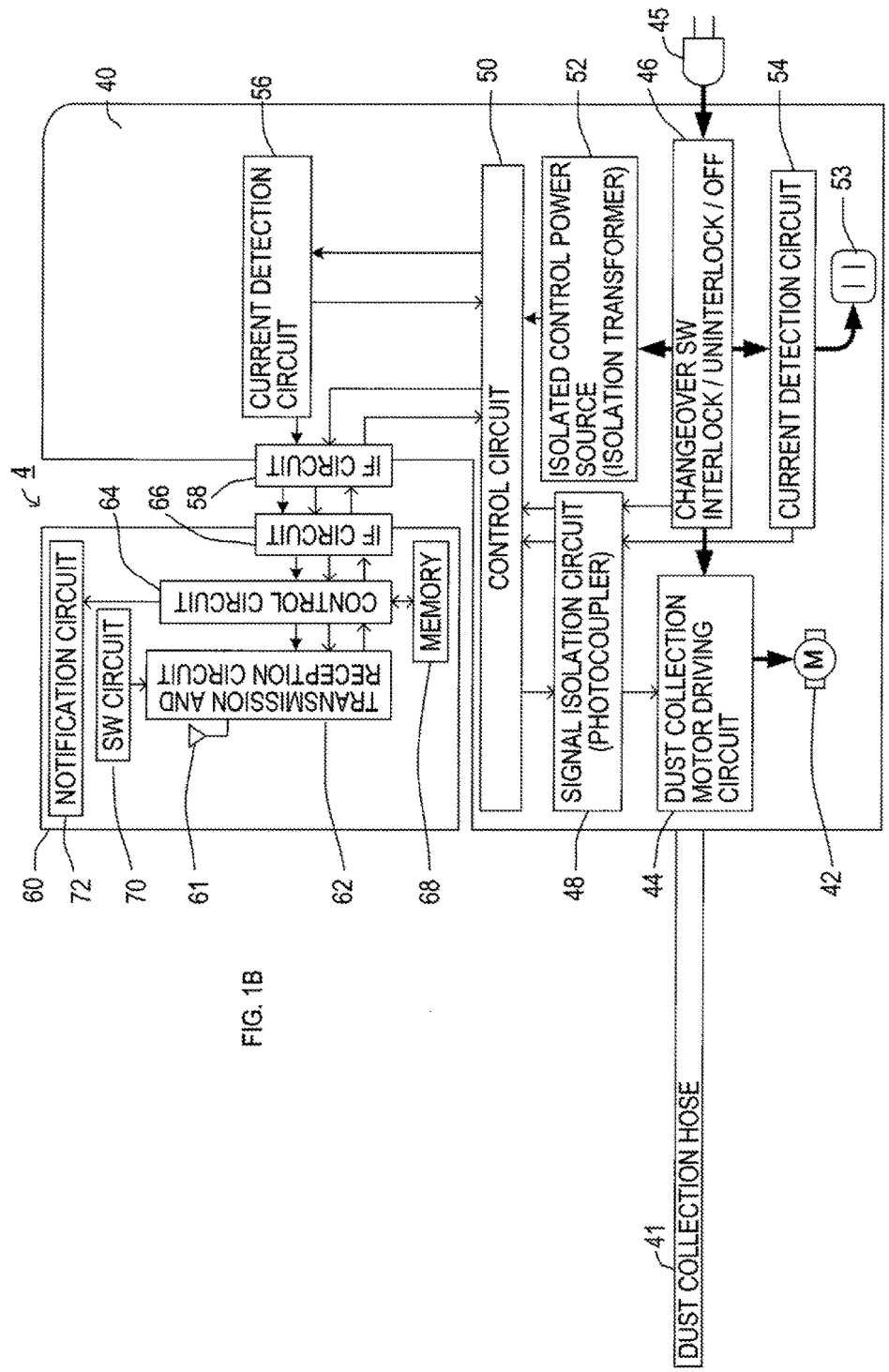
FIG. 1B is a block diagram showing an internal configuration of the dust collector.

As shown in FIG. 1A, a dust collector 4 of the first embodiment comprises a dust collection hose 41, a tip end of which is disposed in the vicinity of an electric power tool 2. The dust collector 4 is configured to suck, through the dust collection hose 41, dust including powder dust or cutting chips discharged from the electric power tool 2. Also, the dust collector 4 comprises a dust-collector main body 40 and a communication unit 60.

The electric power tool 2 is a grinder that cuts a workpiece to be processed, by rotating a cutting grindstone 12 by a motor 14. The electric power tool 2 comprises a tool main body 10, a battery pack 20 that supplies electric power to the tool main body 10, and a communication unit 30 provided between the tool main body 10 and the battery pack 20.

The tool main body 10 comprises the motor 14, a power transmitter (not shown) that transmits rotation of the motor 14 to the cutting grindstone 12, a drive circuit 16 that drives the motor 14 upon receipt of power supply from the battery pack 20, and a trigger switch 18 that is operated by a user to input a drive command for the motor 14.

The communication unit 30 comprises an operation detection circuit 32 that detects a drive state of the motor 14, a transmission and reception circuit 34 that wirelessly communicates with the communication unit 60 in the dust collector 4 via an antenna 33, and a control circuit 36.

The operation detection circuit 32 is configured to detect the drive state of the motor 14 based on an electric current flowing through a power supply path from a battery 22 inside the battery pack 20 to the drive circuit 16.

When the operation detection circuit 32 detects driving of the motor 14 (in other words, operation of the tool main body 10), the control circuit 36 makes the transmission and reception circuit 34 transmit an interlock command to the communication unit 60 in the dust collector 4, thereby making the dust collector 4 perform an interlock operation.

Figure 2:
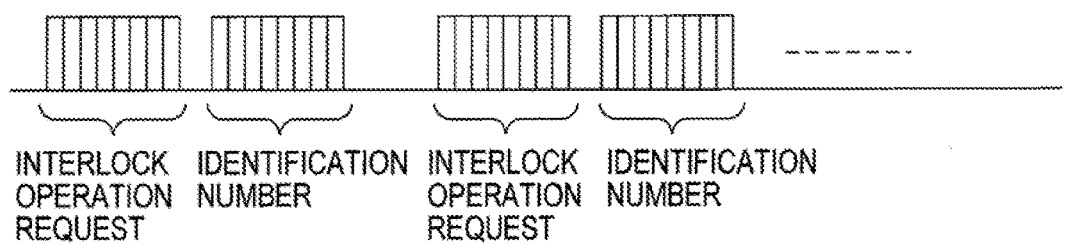
FIG. 2 is an illustrative view illustrating a transmission signal that is transmitted from the electric power tool to the dust collector when the electric power tool and the dust collector operate interlocking with each other.

Moreover, when transmitting the interlock command to the communication unit 60 in the dust collector 4, the communication unit 30 periodically transmits a signal (interlock command), which include an interlock operation request signal and an identification number signal, at a specified time interval, as shown in FIG. 2. The interlock operation request signal is a signal having a specified bit length. The identification number signal is a signal having a specified bit length indicating an identification number (for example, product serial number) of the communication unit 30.

For this reason, the communication unit 30 comprises an identification-number setting portion 37 in which an identification number of the communication unit 30 itself has been set beforehand.

Upon detection of the operation of the tool main body 10 by the operation detection circuit 32, the control circuit 36 reads out the identification number from the identification-number setting portion 37; then, the control circuit 36 periodically outputs, to the transmission and reception circuit 34, the read identification number as identification information specific to the electric power tool 2, together with the interlock operation request signal. The control circuit 36 of the first embodiment is configured as a microcomputer. However, the control circuit 36 may be configured by combining separate various electronic parts; alternatively, the control circuit 36 may be an ASIC (Application Specified Integrated Circuit), a programmable logic device, such as FPGA (Field Programmable Gate Array), etc., or any combination thereof.

Consequently, while the tool main body 10 is operating, the interlock command shown in FIG. 2 is periodically transmitted from the communication unit 30 to the communication unit 60 in the dust collector 4 (see, an interlock operation request process shown in FIG. 3).

Moreover, the communication unit 30 comprises an SW circuit 38 provided with an operation SW (SW is abbreviation of "switch"); the operation SW is used to input a command (registration command) for registering, in the dust collector 4, the identification number of the communication unit 30 itself as the identification information specific to the electric power tool 2.

When an identification-number registration command is inputted from the SW circuit 38 when the operation of the electric power tool 2 is stopped, the control circuit 36 reads out the identification number from the identification-number setting portion 37 and outputs, to the transmission and reception circuit 34, an identification-number registration signal including an identification-number registration request signal and the identification number signal, thereby transmitting an identification-number registration request from the communication unit 30 to the communication unit 60 in the dust-collector main body 40 (see, a registration request process shown in FIG. 3).

Next, the dust-collector main body 40 comprises a dust collection motor 42 for sucking dust including powder dust or cutting chips discharged from the electric power tool 2, a dust collection motor driving circuit 44 that drives the dust collection motor 42, and a power plug 45 that is inserted into an external power outlet to receive power supply from an alternating-current power source so as to supply the received power to the dust collection motor driving circuit 44.

Provided on an alternating current power transmission path extending from the power plug 45 to the dust collection motor driving circuit 44 is a changeover SW 46; the changeover SW 46 is to be changed among three states: making the dust collector 4 operate interlocking with the operation of the electric power tool 2; inhibiting the interlock operation (i.e., making "Uninterlock"); and stopping the operation of the dust collector 4 (i.e., turning "OFF").

If the changeover SW 46 is not in an OFF state (i.e., "Interlock" or "Uninterlock"), an alternating current voltage inputted from the power plug 45 is outputted to the dust collection motor driving circuit 44.

Moreover, the dust-collector main body 40 comprises: a control circuit 50 that controls driving of the dust collection motor 42 by the dust collection motor driving circuit 44; an isolated control power source 52 that generates a direct-current power supply voltage to be supplied to the control circuit 50 and to the communication unit 60 attached to the dust-collector main body 40; and a power outlet 53 that supplies an alternating current power to an external device. Although the control circuit 50 of the first embodiment is configured as a microcomputer, the control circuit 50 may be configured by combining separate various electronic parts; alternatively, the control circuit 50 may be an ASIC, a programmable logic device, such as FPGA, or any combination thereof.

When the changeover SW 46 has been changed to "Interlock" or "Uninterlock", the alternating current power inputted from the power plug 45 is also supplied to the isolated control power source 52 and the power outlet 53 via the changeover switch 46.

Provided on an alternating current power supply path extending from the changeover SW 46 to the power outlet 53 is a current detection circuit 54 that detects an alternating current to be supplied to the external device via the power outlet 53.

Moreover, the dust-collector main body 40 comprises an interface circuit (IF circuit) 58; the IF circuit 58 is configured to supply, as a power source voltage, the direct current voltage generated by the isolated control power source 52 to the communication unit 60; also, the IF circuit 58 is configured to transmit/receive, to/from the communication unit 60, the interlock command transmitted from the communication unit 30 in the electric power tool 2 and information such as a drive state of the dust collection motor 42, etc.

Provided on a direct-current power supply path extending from the isolated control power source 52 to the IF circuit 58 is a current detection circuit 56 that detects a direct current to be supplied to the communication unit 60. From this current detection circuit 56, detection results of the direct current are inputted to the control circuit 50.

Moreover, results of current detection by the current detection circuit 54 and a changeover state of the changeover SW 46 are inputted to the control circuit 50 via a signal isolation circuit 48 comprising a photocoupler.

The control circuit 50 drives the dust collection motor 42 via the dust collection motor driving circuit 44, based on the changeover state of the changeover SW 46 (in this case, "Interlock" or "Uninterlock") as well as a current value of the alternating current supplied from the power outlet 53 to the external device.

Also, the control circuit 50 determines whether the communication unit 60 is attached to the IF circuit 58 based on a current value of the direct current detected by the current detection circuit 56. If the communication unit 60 is attached and the changeover SW 46 has been changed to "Interlock", the control circuit 50 drives the dust collection motor 42 via the dust collection motor driving circuit 44 in accordance with a drive command inputted from the communication unit 60.

Moreover, a control signal, which is outputted from the control circuit 50 to the dust collection motor driving circuit 44, is also inputted to the dust collection motor driving circuit 44 via the signal isolation circuit 48 comprising the photocoupler.

This is because, by means of the signal isolation circuit 48 and the isolated control power source 52, the communication unit 60 to be coupled to the IF circuit 58 is made to be electrically isolated from a path of the alternating current voltage supplied from the external alternating-current power source via the power plug 45.

That is to say, in the first embodiment, the signal isolation circuit 48 and the isolated control power source 52 allow the internal circuits in the dust-collector main body 40, which receive power supply from the external alternating-current power source, to supply electric power to the communication unit 60 or to transmit/receive signals to/from the communication unit 60 while the internal circuits are being isolated from the alternating-current power source. With this configuration, risk of electrical shock to the user when the user touches the IF circuit 58 is to be suppressed or inhibited.

Moreover, the isolated control power source 52 includes an isolation transformer; the isolation transformer receives power supply from the alternating-current power source by dropping the alternating current voltage. Alternatively, an isolating switching power source may be used as the isolated control power source 52 so as to supply a constant voltage direct-current power to the control circuit 50.

Next, the communication unit 60 comprises an IF circuit 66 that comprises a terminal portion attachable to the IF circuit 58 in the dust-collector main body 40, a transmission and reception circuit 62 that wirelessly communicates with the communication unit 30 in the electric power tool 2 via an antenna 61, and a control circuit 64 that is provided between the transmission and reception circuit and the IF circuit 66.

The control circuit 64 is configured to control transmission/reception signals by the transmission and reception circuit 62 and input/output signals by the IF circuit 66.

Specifically, when the transmission and reception circuit 62 receives the interlock operation request signal transmitted from the communication unit 30 of the electric power tool 2, the control circuit 64 determines, based on the identification number signal transmitted together with the interlock operation request signal, whether the electric power tool 2 is an electric power tool as an object of the interlock operation.

If the electric power tool 2 is to be interlocked, the drive command of the dust collection motor 42 is outputted to the control circuit 50 in the dust-collector main body 40 to make the dust collection motor 42 perform the interlock operation.

To enable this, the communication unit 60 comprises a non-volatile memory (hereinafter, simply referred to as a memory) 68 for storing an identification number of the electric power tool as the object of the interlock operation.

When the transmission and reception circuit 62 receives the identification number transmitted from the electric power tool 2, the control circuit 64 determines whether this identification number coincides with the identification number in the memory 68; if these identification numbers coincide, the control circuit 64 makes the dust collection motor 42 perform the interlock operation (see, a tool-registration and interlock-operation control process shown in FIG. 3). Here, the control circuit 64 in the first embodiment is configured as a microcomputer. However, the control circuit 64 may be configured by combining separate various electronic parts; alternatively, the control circuit 64 may be an ASIC, a programmable logic device, such as FPGA, etc., or any combination thereof.

Moreover, the memory 68 for storing the identification number comprises, for example, an EEPROM, a flash memory, or the like, which is capable of additionally registering the identification number and deleting the identification number.

Furthermore, when the identification-number registration request is transmitted to the control circuit 64 from the communication unit 30 in the electric power tool 2, the control circuit 64 additionally registers in the memory 68 the identification number included in this registration request (see the tool-registration and interlock-operation control process shown in FIG. 3).

Moreover, the communication unit 60 comprises a SW circuit 70 and a notification circuit 72; the SW circuit 70 comprises a registration SW for instructing additional registration of the identification number in the memory 68 and a deletion SW for instructing deletion of the identification number registered in the memory 68; the notification circuit 72 is to notify registration results and deletion results of the identification number in the memory 68.

When an additional registration command of the identification number is inputted from the registration SW inside the SW circuit 70, the control circuit 64 executes an additional registration process (see FIG. 4) to obtain the identification number from the electric power tool 2 located around the dust collector 4 and register the identification number in the memory 68. Meanwhile, when a deletion command of the identification number is inputted from the deletion SW inside the SW circuit 70, the control circuit 64 executes an identification-number deletion process (see FIG. 5) to delete the identification number from the memory 68.

Next, referring to FIGS. 3A and 3B, the registration request process and the interlock operation request process, which are executed in the control circuit 36 inside the communication unit 30 of the electric power tool 2, and the tool-registration and interlock-operation control process, which is executed in the control circuit 64 inside the communication unit 60 of the dust collector 4, will be described.

As shown in FIGS. 3A and 3B, the registration request process is a process to be executed as one of main routines in the control circuit 36 when the motor 14 in the electric power tool 2 is stopped. Upon start of this process, in S110 (S represents a step), it is determined whether the identification-number registration command has been inputted from the SW circuit 38.

If the identification-number registration command has not been inputted, S110 is executed again to wait for the registration command to be inputted. However, if it is determined in S110 that the identification-number registration command has been inputted from the SW circuit 38, the process proceeds to S120.

In S120, the above-described signal including the identification-number registration request signal and the identification number signal is outputted to the transmission and reception circuit 34, thereby transmitting the identification-number registration request from the communication unit 30. After the identification-number registration request is transmitted in S120, the process returns to S110.

Next, the interlock operation request process is a process to be executed as one of main routines in the control circuit 36 when the trigger switch 18 is operated to drive the motor 14. Upon start of this process, in S130, it is determined whether a tool current (electric current flowing to the motor 14 via the drive circuit 16), which is detected by the operation detection circuit 32, has exceeded a threshold value pre-set for determining operations of the electric power tool 2.

If the tool current does not exceed the threshold value, S130 is executed again to wait until the tool current exceeds the threshold value (i.e., wait until the electric power tool 2 starts a normal processing operation). If the tool current exceeds the threshold value, the process proceeds to S140.

In S140, the interlock command shown in FIG. 2 is outputted to the transmission and reception circuit 34, thereby transmitting the interlock command from the communication unit 30.

In the subsequent S150, after the transmission of the interlock command, the process waits until a specified time T1 has passed. When the specified time T1 has passed, the process returns to S130.

As a result, in the interlock operation request process, when the tool current exceeds the threshold value (i.e., while the electric power tool 2 is operating), an interlock operation request is to be periodically and repeatedly transmitted at the following time interval; the time interval is obtained by adding the specified time T1 to a transmission time necessary to output the interlock command to the transmission and reception circuit 34, the interlock command including the interlock operation request signal and the identification number signal.

Next, the tool-registration and interlock-operation control process is a process to be repeatedly executed as one of main routines in the control circuit 64. Upon start of this process, in S210, it is determined whether the identification-number registration request has been received in the transmission and reception circuit 62.

Then, if the identification-number registration request has been received in the transmission and reception circuit 62, the process proceeds to S220 to determine whether the identification number transmitted from the electric power tool 2 side has been received in the transmission and reception circuit 62.

In S220, if it is determined that the identification number has been received, the process proceeds to S230 to store (additionally register) the received identification number in the memory 68. In the subsequent S240, completion of storing the identification number is notified (for example, by lighting a success indication lamp comprising an LED, etc.) via the notification circuit 72 and then, the process returns to S210.

However, if it is determined in S220 that the identification number has not been received, in S250, failure of storing the identification number is notified (for example, by lighting an error indication lamp comprising an LED, etc.) via the notification circuit 72 and then, the process returns to S210.

On the other hand, in S210, if it is determined that the identification-number registration request has not been received, the process proceeds to S260 to determine whether the interlock operation request has been received in the transmission and reception circuit 62.

If the interlock operation request has been received in the transmission and reception circuit 62, the process proceeds to in S270 to determine whether the identification number transmitted from the electric power tool 2 side has been received in the transmission and reception circuit 62.

If it is determined in S270 that the identification number has been received, the process proceeds to S280 to determine whether the received identification number is stored (registered) in the memory 68, thereby determining whether the electric power tool 2 that transmitted the interlock operation request is an electric power tool that is an object of the interlock operation.

Then, in S280, if it is determined that the received identification number this time is stored (registered) in the memory 68, the electric power tool that transmitted the identification number is confirmed as the object of the interlock operation; thus, the process proceeds to S290.

In S290, the control circuit 50 in the dust-collector main body 40 is instructed to drive the dust collection motor 42 via the IF circuits 66 and 58, thereby making the dust collection motor 42 (and therefore, the dust collector 4) perform the interlock operation.

After the process in S290 is performed, in S300, the process waits until a specified time T2 has passed. When the specified time T2 has passed, the process returns to S210.

In this regard, the specified time T2 is a time for executing a series of processes S210 to S290 in a time period that is longer than a transmission cycle in which the communication unit 30 in the electric power tool 2 periodically transmits the interlock operation request by the interlock operation request process.

For this reason, the specified time T2 is set to be longer than the specified time T1 during which the process waits in S150 of the interlock operation request process.

However, when negative determination is made in any of S260, S270, and S280, i.e., when the interlock operation is not requested from the electric power tool, when the identification number cannot be received properly, or when the received identification number is not from the electric power tool as the object of the interlock operation, the process proceeds to S310.

In S310, a stop command of the dust collection motor 42 is outputted to the control circuit 50 of the dust-collector main body 40 via the IF circuits 66 and 58, thereby stopping driving of the dust collection motor 42; then, the process returns to S210.

Next, with reference to FIGS. 4A and 4B, an identification-number additional registration process and an identification-number transmission process will be explained; the identification-number additional registration process is executed in the control circuit 64 when the additional registration command of the identification number is inputted from the registration SW inside the SW circuit 70 provided in the communication unit 60 of the dust collector 4; and in conjunction with the identification-number additional registration process, the identification-number transmission process is executed in the control circuit 36 inside the communication unit 30 of the electric power tool 2.

The additional registration process is a process to be executed as one of main routines in the control circuit 64, together with the above-described tool-registration and interlock-operation control process. Upon start of the additional registration process, in S410, it is determined whether the registration SW inside the SW circuit 38 is in an ON state.

If the registration SW is not in the ON state, S410 is executed again to wait for the registration SW to be changed to the ON state. When it is determined in S410 that the registration SW is in the ON state, the process proceeds to S420.

In S420, an identification-number transmission request is outputted to the transmission and reception circuit 62, thereby making the transmission and reception circuit 62 transmit a transmission request for the identification number to the electric power tool 2 located around the dust collector 4.

Figure 4A:
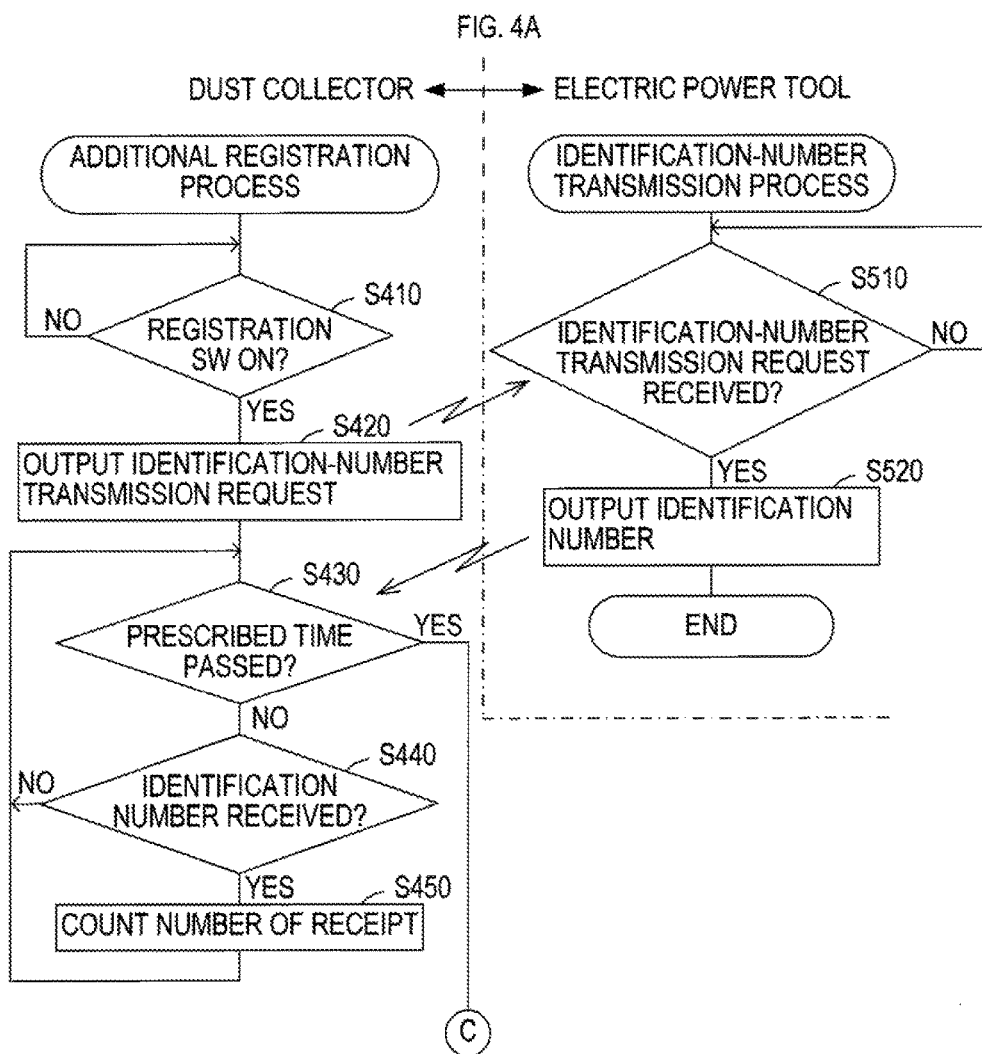
FIG. 4A shows a flowchart of a part of an identification-number additional registration process executed in the dust collector, and a flowchart of an identification-number transmission process executed in the electric power tool in response to the additional registration process.

On the other hand, in the communication unit 30 provided in the electric power tool 2, the control circuit 36 is configured to execute the identification-number transmission process shown in FIG. 4A as one of main routines.

In this identification-number transmission process, in S510, it is determined whether the transmission and reception circuit 62 has received the identification-number transmission request transmitted from the communication unit 60 in the dust collector 4, thereby waiting for the identification-number transmission request to be received in the transmission and reception circuit 62.

If it is determined in S510 that the identification-number transmission request has been received in the transmission and reception circuit 62, the process proceeds to S520; in S520, from the identification-number setting portion 37, the identification number of itself is read out and then outputted to the transmission and reception circuit 34, so as to make the transmission and reception circuit 34 transmit the identification number; then, the present identification-number transmission process is terminated.

Here, after the termination, the identification-number transmission process is restarted after a specified waiting time has elapsed, and is executed in the same manner as described above.

For this reason, in the additional registration process in the dust collector 4 side, in S420, the transmission request of the identification number is transmitted from the transmission and reception circuit 62; thereafter, in S430, the identification number is transmitted from the nearby electric power tool 2 and then, it is determined whether a prescribed time necessary for the transmission and reception circuit 62 to receive this identification number has passed.

When the prescribed time has not yet been passed, it is determined in S440 whether the identification number has been received. If the identification number has been received, in S450, a number of the identification numbers received before the prescribed time has passed ("Received Number") is counted and then, the process returns to S430. Also, if it is determined in S440 that the identification number has not yet been received, the process proceeds to S430.

Here, a transmission power of the transmission and reception circuit 62 is set to be low, compared with the transmission and reception circuit 34 inside the communication unit 30 provided in the electric power tool 2.

This is because, a receivable distance at which the electric power tool 2 is capable of receiving the transmission request of the identification number is made to be shorter than a receivable distance at which the communication unit 60 of the dust collector 4 can properly receive an electric wave transmitted from the transmission and reception circuit inside the communication unit 30.

Specifically, a transmission power from the communication unit 30 in the electric power tool 2 is set to correspond to a length of the dust collection hose 41 (for example, 5 to 10 m), so that even if the dust collection hose 41 is fully extended, the communication unit 60 in the dust collector 4 can receive an electric wave transmitted from the electric power tool 2 in relation to which the tip end of the dust collection hose 41 is disposed.

On the other hand, a transmission power from the communication unit 60 in the dust collector 4 is set such that the receivable distance at which the electric power tool 2 side is capable of receiving is sufficiently shorter (for example, about 1 m) than the length of the dust collection hose 41.

As a result, when the user operates the registration SW to store (register) the identification number of the electric power tool 2 in the memory 68, the electric power tool 2 to be registered is made close to the dust collector 4, thereby allowing an electric wave transmitted from the communication unit 60 of the dust collector 4 to reach the electric power tool 2 to be registered, while making it difficult for this electric wave to reach an electric power tool 2 that does not require the interlock operation with the dust collector 4.

Next, in S430, if it is determined that the prescribed time has passed, the process proceeds to S460 to determine whether the Received Number of the identification number counted in S450 is "1". If "Received Number=1" is satisfied, the process proceeds to S470 to store (additionally register) the received identification number in the memory 68.

In the subsequent S480, as in the above-described S240, completion of storing the identification number is notified via the notification circuit 72 and then, the present additional registration process is terminated.

However, if it is determined in S460 that the Received Number of the identification number is not "1", i.e., if the identification number cannot be received or if a plurality of the identification numbers are received, the process proceeds to S490 to notify, as in the above-described S250, failure of storing the identification number via the notification circuit 72 and then, the present additional registration process is terminated.

Here, after the termination, the additional registration process is restarted after a specified waiting time has elapsed, and is executed in the same manner as described above.

Figure 5:
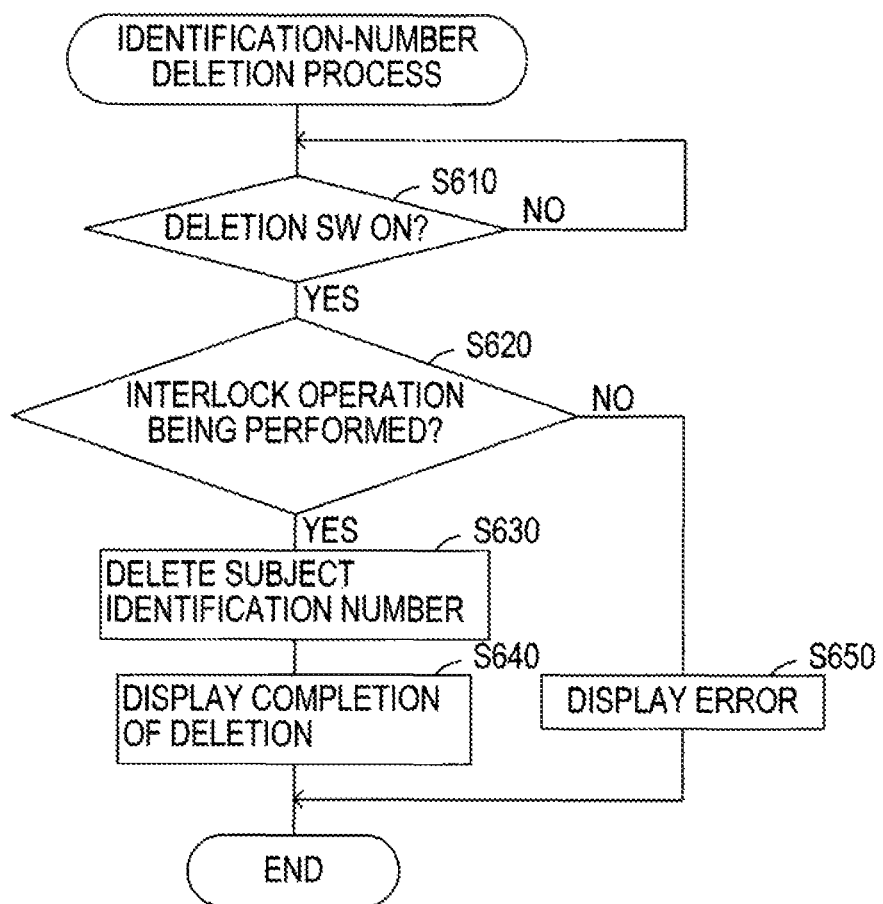
FIG. 5 is a flowchart of an identification-number deletion process executed in the dust collector.

Next, the identification-number deletion process will be explained with reference to FIG. 5; the identification-number deletion process is executed in the control circuit 64 when the deletion command of the identification number is inputted from the deletion SW inside the SW circuit 70 provided in the communication unit 60 of the dust collector 4.

The identification-number deletion process is a process to be executed as one of main routines in the control circuit 64, together with the above-described tool-registration and interlock-operation control process and the additional registration process. Upon start of the identification-number deletion process, in S610, it is determined whether the deletion SW inside the SW circuit 38 is in an ON state.

If the deletion SW is not in the ON state, S610 is executed again to wait for the registration SW to become the ON state. If it is determined in S610 that the registration SW is in the ON state, the process proceeds to S620.

In S620, it is determined whether the dust collection motor 42 in the dust-collector main body 40 is currently being driven (i.e., whether the dust collection motor 42 is performing the interlock operation). If the dust collection motor 42 is performing the interlock operation, the process proceeds to S630.

In S630, the identification number of the electric power tool 2 with which the dust collection motor 42 is currently made to perform the interlock operation is confirmed, and this identification number is deleted from the memory 68, thereby erasing the registration of this electric power tool 2.

Then in S640, the deletion of the identification number from the memory 68 is notified via the notification circuit 72 and then, the present identification-number deletion process is terminated.

However, if it is determined in S620 that the dust collection motor 42 is not currently made to perform the interlock operation, the identification number to be deleted from the memory 68 cannot be identified and thus, failure of deletion of the identification number is notified via the notification circuit 72; then, the present identification-number deletion process is terminated.

Here, after the termination, the identification-number deletion process is restarted after a specified waiting time has elapsed, and is executed in the same manner as described above.

As explained above, in the dust collector 4 of the first embodiment, the control circuit 64 inside the communication unit 60 executes the above-described tool-registration and interlock-operation control process; accordingly, the dust collector 4 can be made to perform the interlock operation only when the electric power tool 2 that sent the interlock operation request is the electric power tool pre-stored in the memory 68 as an object of the interlock operation.

For this reason, even if a plurality of electric power tools that transmit the interlock operation requests are present around the dust collector 4, it is possible to suppress or inhibit the dust collector 4 from being operated contrary to the user's intention, by the interlock operation request from the electric power tools.

Moreover, the interlock operation request from the electric power tool 2 is made by periodically transmitting the signal including the interlock operation request signal and the identification signal. Therefore, in the dust collector 4 side, operation of the dust collection motor 42 can be started at a timing of receipt of the signal and also, a start timing of the interlock operation can be made to correspond to operation of the electric power tool 2.

Furthermore, the electric power tool 2 periodically and repeatedly transmits the interlock operation request. Meanwhile, when the dust collector 4 cannot receive the interlock operation request, driving of the dust collection motor 42 (in other words, the interlock operation of the dust collector 4) is stopped.

Accordingly, compared with a case where the electric power tool 2 is configured to transmit a signal instructing start and a signal instructing stop of the interlock operation, the interlock operation of the dust collector 4 can be reliably stopped.

That is, in the case where the electric power tool 2 is configured to transmit a signal instructing start and a signal instructing stop of the interlock operation, if the transmission and reception circuit 62 cannot receive a stop command from the electric power tool 2 due to change in a communication condition between the dust collector 4 and the electric power tool 2, it is impossible to stop the driving of the dust collection motor 42.

However, according to the dust collector 4 of the first embodiment, it is possible to reliably stop the driving of the dust collection motor 42 without causing the aforementioned problem.

Moreover, in the dust collector 4, the identification number of the electric power tool 2 as an object of the interlock operation can be additionally registered in accordance with a command from the SW circuit 38 provided in the communication unit 30 of the electric power tool 2 or from the SW circuit 70 (specifically, the registration SW) provided in the communication unit 60 of the dust collector 4.

Furthermore, the registration of the identification number of the electric power tool 2 as an object of the interlock operation can be removed by a command from the SW circuit 70 (specifically, the deletion SW) provided in the communication unit 60 of the dust collector 4.

Accordingly, the user can arbitrarily set, in the dust collector 4, the electric power tool 2 as an object of the interlock operation and also, the setting operation can be easily made by operating a switch in the electric power tool 2 side or the dust collector 4 side.

Moreover, whether or not this operation of the switch can property register or delete the identification information is notified (in the first embodiment, displayed by lighting an LED, etc.) via the notification circuit 72 provided in the communication unit 60 of the dust collector 4. Therefore, the user can confirm registration results or deletion results of the identification information by confirming the state of the notification.

Thus, the dust collector 4 of the first embodiment provides excellent usability to the users.

Here, in the first embodiment, the dust collection hose 41 and the dust collection motor 42 correspond to one example of a dust collection portion of the present invention; the antenna 61 and the transmission and reception circuit 62 in the communication unit 60 correspond to one example of a communication portion of the present invention; the control circuit 64 in the communication unit 60 and the control circuit 50 in the dust-collector main body 40 correspond to one example of an interlock operation control portion of the present invention; and the memory 68 in the communication unit 60 corresponds to one example of a storage portion of the present invention.

Moreover, the registration SW in the SW circuit 70 provided in the communication unit 60 corresponds to one example of a registration operation portion of the present invention; likewise, the deletion SW corresponds to one example of a deletion operation portion of the present invention; and the notification circuit 72 corresponds to one example of a notification portion of the present invention.

Second Embodiment

The second embodiment is made by modifying part of respective configurations of the electric power tool 2 and the dust collector 4 in the first embodiment. Accordingly, in the following description, the same configurations as those of the first embodiment are assigned with the same reference numerals as those used in the first embodiment, and will not be explained; only different configurations will be explained.

Figure 7A:
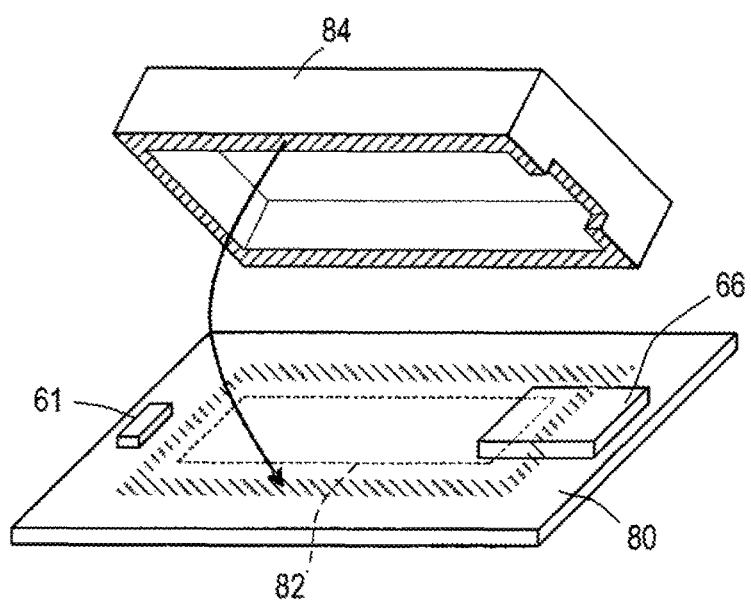
FIGS. 7A and 7B are illustrative views each showing a configuration of a communication unit provided in the dust collector.

In the communication unit 60 of the second embodiment, the antenna 61, the transmission and reception circuit 62, the control circuit 64, the IF circuit 66, the memory 68, the SW circuit 70, and the notification circuit 72 are all formed by a circuit pattern(s) of a circuit board 80 shown in FIG. 7A and electronic components mounted on the circuit board 80.

As shown in FIG. 7A, the antenna 61 and the IF circuit 66 (specifically, a connector for connection to the dust-collector main body 40) are mounted, respectively, on both ends of the circuit board 80. In the circuit board 80, a component mounting area 82 is set between the antenna 61 and the IF circuit 66; the component mounting area 82 is provided for electronic components forming the transmission and reception circuit 62, the control circuit 64, the memory 68, the SW circuit 70, and the notification circuit 72.

Moreover, a resin case 84 for waterproofing is to be attached to the circuit board 80 so as to cover the component mounting area 82 on which respective electronic components of the aforementioned circuits are mounted.

Moreover, the resin case 84 is configured to cover, in addition to the component mounting area 82, part of the IF circuit 66 excluding a connection portion to the dust-collector main body 40.

Figure 7B:
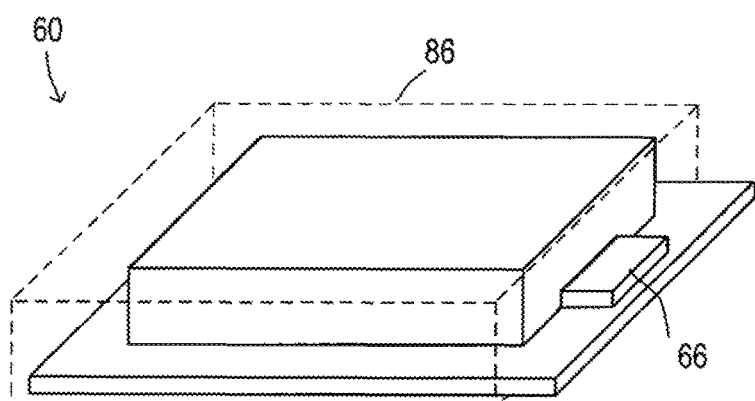

As shown in FIG. 7B, the circuit board 80 with the component mounting area 82 being covered by the resin case 84 for waterproofing is housed in an outer case 86 made of synthetic resin.

The outer case 86 is formed in a shape allowing the connection portion of the IF circuit 66 to protrude outside therefrom, and via this connection portion, the communication unit 60 is coupled to the IF circuit 58 of the dust-collector main body 40.

Figure 8A:
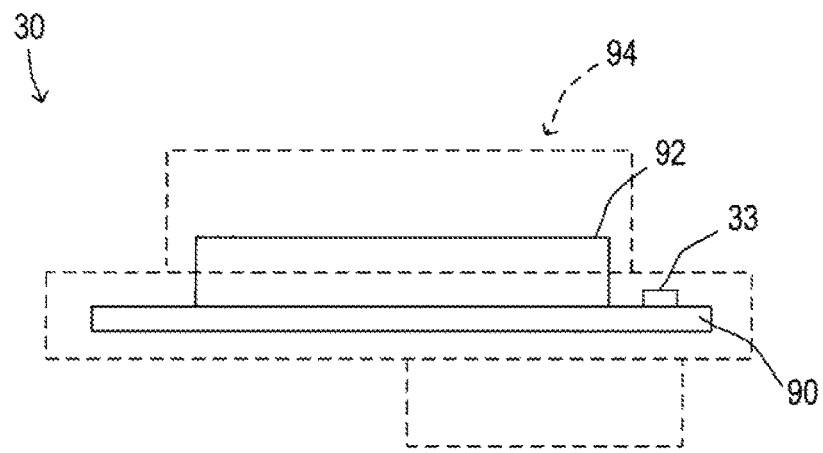
FIGS. 8A and 8B are illustrative views each showing a configuration of a communication unit provided in the electric power tool.

In the communication unit 30 of the second embodiment, as in the communication unit 60 of the dust collector 4, electronic components that form the operation detection circuit 32, the antenna 33, the transmission and reception circuit 34, the control circuit 36, the SW circuit 38, and the identification-number setting portion 37 are mounted on a circuit board 90 shown in FIG. 8A.

As shown in FIG. 8A, the antenna 33 is mounted on an end of the circuit board 90, and the electronic components excluding the antenna 33 are mounted on a component mounting area in a central part of the circuit board 90. Moreover, as in the communication unit 60 of the dust collector 4, the component mounting area is covered by a resin case 92 for waterproofing.

The above-described circuit board 90, on which the electronic components are mounted and to which the resin case 92 is attached so as to cover the electronic components excluding the antenna 33, is housed in an outer case 94, as in the communication unit 60 of the dust collector 4.

Figure 8B:
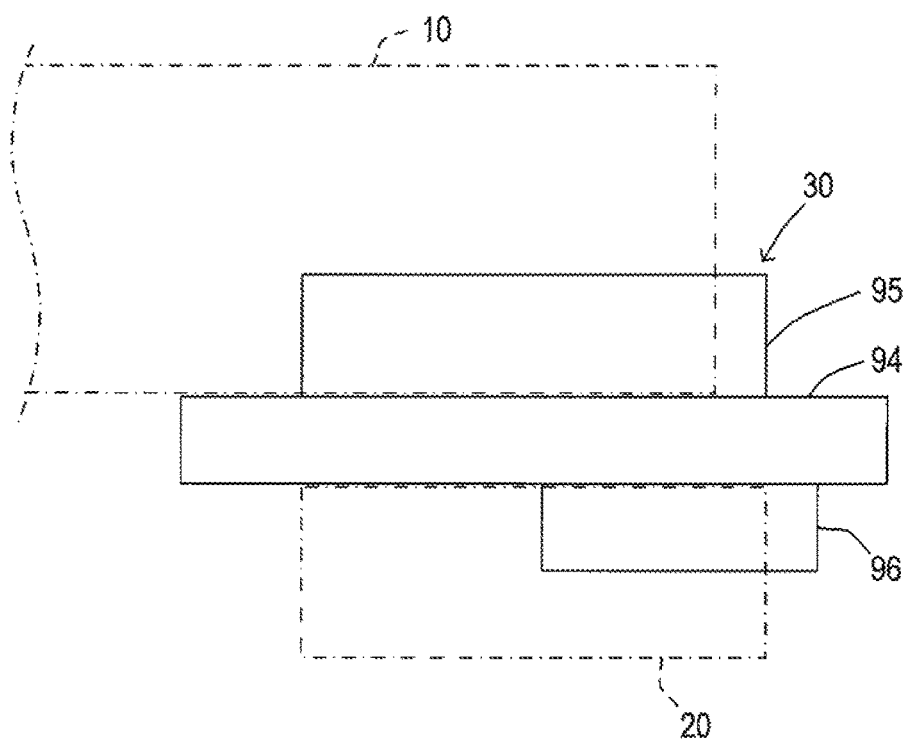

In order to have a function of coupling the tool main body 10 to the battery pack 20, as shown in FIG. 8B, the outer case 94 comprises an attachment portion 95 for the tool main body 10, which is formed at a side where a mounting surface for the electronic components exists in the circuit board 90, and an attachment portion 96 for the battery pack 20, which is formed in an opposite side to the mounting surface.

A rear end side of the tool main body 10 is to be attached to the attachment portion 95 in a state where the tip end side of the tool main body 10, to which the cutting grindstone 12 is to be attached, is protruded from an opposite side to the antenna 33. The battery pack 20 is to be attached to the attachment portion 96.

As explained above, in the dust collector 4 of the second embodiment, the signal isolation circuit 48 comprising a photocoupler and the isolated control power source 52 comprising an isolation transformer are provided inside the dust-collector main body 40; with these components, a path of an alternating current voltage supplied from the external alternating-current power source is electrically isolated from the communication unit 60.

For this reason, by supplying electric power and transmitting/receiving signals to/from the communication unit 60 that is isolated from the alternating-current power source, it becomes possible to eliminate or reduce risk of electrical shock in a case where the user touches a terminal of the IF circuit 58 when attaching the communication unit 60 to the dust-collector main body 40; consequently, improved safety can be achieved.

Moreover, in the communication unit 60, the antenna 61 is disposed, across the internal circuits such as the control circuit 64, at an opposite side to the IF circuit 66 that is a signal input/output portion in the communication unit 60 side. For this reason, the antenna 61 can be disposed away from a connection portion to the dust-collector main body 40, which may interfere with the wireless communication; thus, the wireless communication by the antenna 61 can be favorably achieved.

Furthermore, in the communication unit 60, all of the constituent components (electronic components) excluding the antenna 61 and the connector of the IF circuit 66 are to be covered by the resin case 84 for waterproofing on the circuit board 80. Thus, waterproof properties of the communication unit 60 can be enhanced.

Moreover, especially, the communication unit 30 of the electric power tool 2 is likely to be splashed with water when the electric power tool 2 is used. However, also in the communication unit 30, constituent components (electronic components) excluding the antenna 33 are to be covered by the resin case 92 for waterproofing on the circuit board 90. Thus, waterproof properties can be enhanced, and malfunctions caused by splashing water to the communication unit 30 can be reduced.

Also, in the dust-collector main body 40, the current detection circuit 56 is provided on the path for the direct current power supplied from the isolated control power source 52 to the communication unit 60. The control circuit 50 is configured to detect that the communication unit 60 has been attached based on the detected electric current by the current detection circuit 56.

With this configuration, it is possible to detect attachment of the communication unit without providing, in the dust-collector main body 40, a terminal dedicated to detection of attachment of the communication unit 60. Thus, a size of a connector constituting the IF circuit 58 can be reduced, thereby facilitating downsizing and cost reduction of the dust-collector main body 40.

Here, in the present embodiment, the isolated control power source 52 and the signal isolation circuit 48 correspond to one example of an isolation device of the present invention; and among these two, especially, the signal isolation circuit 48 corresponds to one example of a contactless circuit of the present invention. Moreover, the IF circuit 66 corresponds to one example of a signal input portion of the present invention; and the control circuit 64 corresponds to one example of a communication control portion of the present invention.

The exemplified embodiments of the present invention have been described as above; however, the present invention should not be limited to the above-described first and second embodiments, but can take various forms within the scope not departing from the spirit of the present invention.

For example, in the above-described embodiments, the electric working machine as an object of the interlock operation with the dust collector 4 is a grinder; however, any electric working machine in other forms, such as a circular saw, a plane, etc., which discharges powder dust or cutting chips during the operation.

Moreover, in the above-described embodiments, the dust collector 4 comprises the dust-collector main body 40 and the communication unit 60 that is separately provided from and is detachably attached to the dust-collector main body 40. However, the dust collector 4 may contain a communication circuit having the same communication function as that of the communication unit 60.

In above-described embodiments, the dust collector 4 is configured to be able to additionally register and delete, in and from the memory 68, the identification number of the electric power tool 2 as an object of the interlock operation; however, the dust collector 4 may be configured not to perform part or all of the above-described additional registration and deletion of the identification number.

Figure 4B:
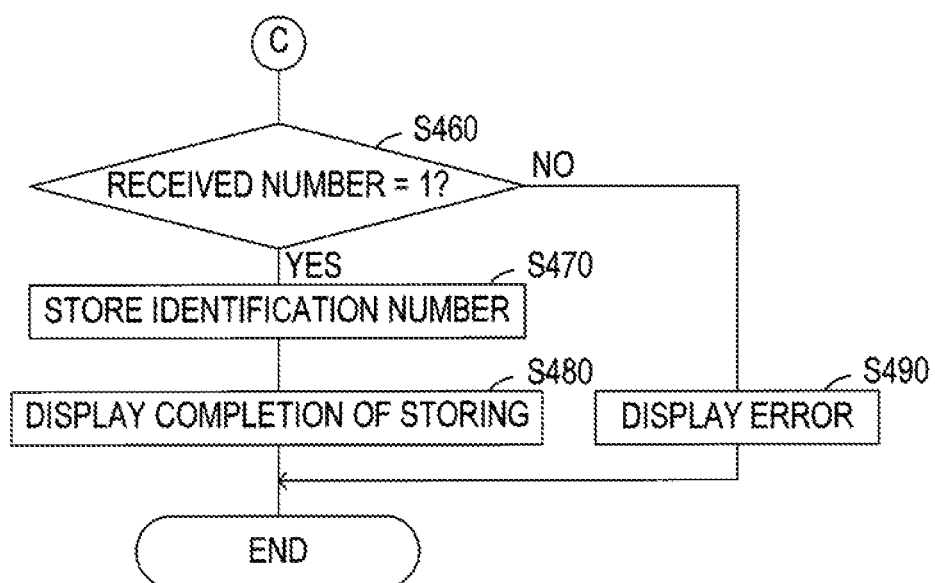
FIG. 4B is a flowchart of the rest of the additional registration process.

For example, according to the dust collector 4 of the above-described embodiments, the user can operate the registration SW of the SW circuit 70 provided in the communication unit 60 to make the control circuit 64 execute the additional registration process shown in FIGS. 4A and 4B, thereby additional registering the identification number of the electric power tool 2.

Therefore, it is not absolutely necessary to provide the SW circuit 38 for registration of the identification number in the communication unit 30 of the electric power tool 2. In other words, it is not necessary to use the SW circuit 38 to make the control circuit 36 in the electric power tool 2 execute the registration request process shown in FIG. 3A, thereby making the control circuit 64 of the dust collector 4 register the identification number of the electric power tool 2.

As described above, if the SW circuit 38 is not provided in the communication unit 30 of the electric power tool 2, downsizing and cost reduction of the communication unit 30 can be achieved and therefore, demand for reducing size and weight of the electric power tool 2 can be met.

Moreover, in the above-described embodiments, the identification number (product serial number, etc.) of the communication unit 30 is stored as the identification information of the electric power tool 2 in the memory 68 and based on this identification number, it is determined whether to make the dust collection motor 42 perform the interlock operation; however, any identification information that can be used to identify an electric working machine as an object of the interlock operation may be stored in the memory 68.

Meanwhile, in the above-described embodiments, the identification-number transmission process shown in FIG. 4A, which is executed by the control circuit 36 inside the communication unit 30 of the electric power tool 2, may be modified as shown in FIG. 6.

Specifically, in the identification-number transmission process shown in FIG. 6, if it is determined in S510 that the identification-number transmission request has been received in the transmission and reception circuit 62, the process proceeds to S515 to determine whether the trigger switch 18 is in an ON state.

If the trigger switch 18 is in the ON state, the process proceeds to S520 to transmit the identification number of the communication unit 30 from the transmission and reception circuit 34. However, if the trigger switch 18 is not in the ON state, the current identification-number transmission process is terminated without transmitting the identification number.

If the identification-number transmission process, which is executed in the control circuit 36 in the electric power tool 2, is modified as described above, it is possible to reduce a number of the electric power tools 2 that send the identification number in response to the identification-number transmission request transmitted by the additional registration process shown in FIGS. 4A and 4B, thereby increasing possibility for the control circuit 64 to additionally register the identification number in the memory 68.

Specifically, in the additional registration process shown in FIGS. 4A and 4B, the identification-number transmission request is transmitted to an area around the dust collector 4 via the transmission and reception circuit 62, so that the identification number of the electric power tool 2 located in the aforementioned area can be obtained and additionally registered in the memory 68. However, if multiple identification numbers are obtained, the identification number to be additionally registered cannot be identified; therefore, the additional registration to the memory 68 is inhibited.

In this regard, if the identification-number transmission process executed in the electric power tool 2 is modified as shown in FIG. 6, the identification number is transmitted on the condition that the trigger switch 18 is in the ON state. Accordingly, it is possible to reduce possibility for the multiple electric power tools 2 to transmit the identification numbers, thereby facilitating additional registration of the identification number in the memory 68.

Moreover, when the user operates the trigger switch 18 of the electric power tool 2, the identification number of which is desired to be registered, simultaneously with or immediately after operating the registration SW of the dust collector 4, the identification number of this electric power tool 2 can be additionally registered in the memory 68 of the dust collector 4.

Thus, the user can more reliably register a desired electric power tool 2 as a tool with which the dust collector 4 is made to perform the interlock operation. In addition, it is possible to further reduce possibility of erroneous registration of an electric power tool that is not an object of the interlock operation.

Moreover, in the above-described first and second embodiments, in order to isolate between the communication unit 60 and the external alternating-current power source, the isolated control power source 52 comprising the isolation transformer and the signal isolation circuit 48 comprising the photocoupler are provided in the dust-collector main body 40. However, an isolation transformer and a photocoupler may be provided in the IF circuit 58, thereby electrically isolating between the dust-collector main body 40 and the communication unit 60.

In addition, this isolation is sufficient when a leakage current flowing from the dust-collector main body 40 to the communication unit 60 is limited to a specified value or below. Thus, for example, a capacitor or a resistor may be provided in the current path so that the current path has impedance.

Moreover, as the isolated control power source 52, an isolating switching power supply may be used.

Furthermore, in the above-described first and second embodiments, a direct current voltage generated by the isolated control power source 52 is supplied, as a power source voltage, to the communication unit 60. However, it is not absolutely necessarily to supply power from the dust-collector main body 40 to the communication unit 60, and the communication unit 60 may be configured to contain a battery as a direct-current power source.

In this configuration, by simply providing a photocoupler, etc. between the dust-collector main body 40 and the communication unit 60, it is possible to isolate between the alternating-current power source and the communication unit 60; consequently, a function as an isolation device can be very easily obtained.

Furthermore, in the second embodiment, it has been described that in the communication units 30 and 60, the antennas 33 and 61 are, respectively disposed outside the resin cases 84 and 92; however, the antennas 33 and 61 may be housed inside the resin cases 84 and 92, respectively.

The invention claimed is:

1. A dust collector comprising:
   a dust collection portion configured to suck dust through a dust collection hose;
   a communication portion configured to wirelessly communicate with an electric working machine;
   a power plug configured to receive an alternating-current power from an alternating-current power source;
   a changeover switch directly electrically coupled to the power plug, wherein the changeover switch is configured to be changed into a first state, a second state, and a third state, wherein the changeover switch in the first state makes the dust collection portion operate interlocking with an operation of the electric working machine, the changeover switch in the second state inhibits the dust collection portion from an interlock operation with the operation of the electric working machine, and the changeover switch in the third state stops an operation of the dust collection portion; and
   an interlock operation control portion configured to make the dust collection portion perform the interlock operation with the electric working machine in response to receipt of an interlock command by the communication portion with the changeover switch being in the first state, wherein the interlock command is periodically transmitted from the electric working machine,
   wherein the interlock operation control portion includes a storage portion in which identification information is stored, the identification information being specific to the electric working machine with which the dust collection portion is to be made to perform the interlock operation,
   wherein the interlock command includes an interlock operation request signal and an identification signal, the interlock operation request signal requesting the interlock operation, and the identification signal indicating the identification information, and
   wherein the interlock operation control portion is further configured such that,
   the interlock operation control portion makes the dust collection portion perform the interlock operation in response to receipt of the interlock command by the communication portion during operation of the electric working machine, and
   the interlock operation control portion stops the interlock operation of the dust collection portion in response to no receipt of the interlock command by the communication portion for a specified period of time or more.

2. The dust collector according to claim 1, wherein the specified period of time is set to be longer than a transmission cycle in which the electric working machine periodically transmits the interlock command.

3. The dust collector according to claim 1, wherein:
   the dust collection portion includes:
     a motor; and
     a motor driving circuit configured to drive the motor; and
   the dust collector includes a transmission path extending from the power plug through the changeover switch to the motor driving circuit.

4. The dust collector according to claim 1, further comprising a signal isolation circuit coupled to the changeover switch and the interlock operation control portion,
   wherein a state of the changeover switch is inputted to the interlock operation control portion via the signal isolation circuit.

5. The dust collector according to claim 4,
   wherein the signal isolation circuit includes a photocoupler.

6. The dust collector according to claim 1, further comprising a control power source configured to receive the alternating-current power from the alternating-current power source, the control power source being configured to generate a direct-current voltage,
   wherein the changeover switch is coupled to the control power source.

7. The dust collector according to claim 6,
   wherein the control power source is electrically coupled to the power plug via the changeover switch in the first state or the second state.

8. The dust collector according to claim 7, wherein the control power source is supplied power via the power plug and the changeover switch independent of the power supplied to the dust collection portion.

9. The dust collector according to claim 6,
   wherein the control power source includes an isolation transformer.

10. The dust collector according to claim 1, further comprising a power outlet configured to receive the alternating-current power from the alternating-current power source, the power outlet being configured to supply an alternating-current power to an external device,
    wherein the changeover switch is coupled to the power outlet.

11. The dust collector according to claim 10,
    wherein the power outlet is electrically coupled to the power plug via the changeover switch in the first state or the second state.

* * * * *